United States Patent
Kwon et al.

(10) Patent No.: US 12,400,107 B2
(45) Date of Patent: Aug. 26, 2025

(54) APPARATUS AND METHOD WITH NEURAL NETWORK OPERATIONS

(71) Applicant: SAMSUNG ELECTRONICS CO., LTD., Suwon-si (KR)

(72) Inventors: Soon-Wan Kwon, Yongin-si (KR); Minje Kim, Hwaseong-si (KR); Sang Joon Kim, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 974 days.

(21) Appl. No.: 17/408,951

(22) Filed: Aug. 23, 2021

(65) Prior Publication Data

US 2022/0343147 A1 Oct. 27, 2022

(30) Foreign Application Priority Data

Apr. 21, 2021 (KR) .................. 10-2021-0051857

(51) Int. Cl.
*G06N 3/063* (2023.01)
*G06F 7/501* (2006.01)
(Continued)

(52) U.S. Cl.
CPC ............. *G06N 3/063* (2013.01); *G06F 7/501* (2013.01); *G06F 17/16* (2013.01); *G06N 3/045* (2023.01); *G06N 3/049* (2013.01); *H03M 1/12* (2013.01)

(58) Field of Classification Search
CPC ........ G06N 3/063; G06N 3/045; G06N 3/049; G06N 3/0442; G06N 3/0464; G06N 3/048;
(Continued)

(56) References Cited

U.S. PATENT DOCUMENTS 6,539,368 B1 * 3/2003 Chernikov ............. G06N 3/048
706/41
8,024,394 B2 * 9/2011 Prokopenko .......... G06F 9/3877
708/513

(Continued)

FOREIGN PATENT DOCUMENTS

KR 10-2018-0004026 A 1/2018
KR 10-2019-0029406 A 3/2019
(Continued)

OTHER PUBLICATIONS

Jiang, Zhewei et al., "XNOR-SRAM: In-Bitcell Computing SRAM Macro based on Resistive Computing Mechanism", *Special Session 3: Recent Advances in Near and In-Memory Computing Circuit and Architecture for Artificial Intelligence and Machine Learning*, GLSVLSI '19, May 9-11, 2019, Tysons Corner, VA, USA (6 pages in English).

(Continued)

*Primary Examiner* — Farley Abad
(74) *Attorney, Agent, or Firm* — NSIP Law

(57) ABSTRACT

A neural network apparatus includes: a first processing circuit and a second processing circuit each configured to perform a vector-by-matrix multiplication (VMM) operation on a weight and an input activation; a first register configured to store an output of the first processing circuit; an adder configured to add an output of the first register and an output of the second processing circuit; a second register configured to store an output of the adder; and an input circuit configured to input a same input activation to the first processing circuit and the second processing circuit and control the first processing circuit and the second processing circuit.

24 Claims, 11 Drawing Sheets

(51) Int. Cl.
*G06F 17/16* (2006.01)
*G06N 3/045* (2023.01)
*G06N 3/049* (2023.01)
*H03M 1/12* (2006.01)

(58) Field of Classification Search
CPC ......... G06N 3/065; G06F 7/501; G06F 17/16; G06F 2207/4802; G06F 7/5443; G06F 5/08; H03M 1/12; G11C 7/1006; G11C 7/16; G11C 11/54; G11C 13/0002
See application file for complete search history.

(56) References Cited

U.S. PATENT DOCUMENTS

| | | | |
|---|---|---|---|
| 9,710,265 B1* | 7/2017 | Temam | G06N 3/045 |
| 11,467,969 B2 | 10/2022 | Nagy et al. | |
| 11,537,838 B2 | 12/2022 | Norden et al. | |
| 11,681,899 B2 | 6/2023 | Kim et al. | |
| 2017/0011006 A1* | 1/2017 | Saber | G06N 3/063 |
| 2018/0004708 A1* | 1/2018 | Muralimanohar | G06F 17/16 |
| 2018/0046916 A1* | 2/2018 | Dally | G06F 7/523 |
| 2018/0095930 A1* | 4/2018 | Lu | G11C 13/0002 |
| 2018/0113649 A1* | 4/2018 | Shafiee Ardestani | G06N 3/063 |
| 2018/0321942 A1* | 11/2018 | Yu | G06F 9/30036 |
| 2018/0336163 A1* | 11/2018 | Phelps | G06F 15/8046 |
| 2019/0057050 A1 | 2/2019 | Mathuriya et al. | |
| 2019/0279083 A1* | 9/2019 | Gold | G06F 9/5077 |
| 2019/0303749 A1* | 10/2019 | Appuswamy | G06F 17/16 |
| 2019/0370645 A1* | 12/2019 | Lee | G06N 3/063 |
| 2020/0089472 A1* | 3/2020 | Pareek | G06F 9/3001 |
| 2021/0142086 A1* | 5/2021 | Berkovich | G06N 3/04 |
| 2021/0192324 A1* | 6/2021 | Srivastava | G11C 11/412 |
| 2022/0019408 A1 | 1/2022 | Kim et al. | |

FOREIGN PATENT DOCUMENTS

| | | | |
|---|---|---|---|
| KR | 10-2019-0052587 A | | 5/2019 |
| KR | 10-2023095 B1 | | 9/2019 |
| KR | 10-2020-0069901 A | | 6/2020 |
| KR | 10-2020-0143479 A | | 12/2020 |
| KR | 10-2020-0143686 A | | 12/2020 |
| KR | 10-2021-0000313 A | | 1/2021 |
| KR | 10-2022-0010362 A | | 1/2022 |

OTHER PUBLICATIONS

Valavi, Hossein et al., "A 64-Tile 2.4-Mb In Memory-Computing CNN Accelerator Employing Charge-Domain Compute", *IEEE Journal of Solid-State Circuits,* vol. 54, No. 6, Jun. 2019 (pp. 1789-1799).

Wang, Xinxin et al., "A Crossbar-Based In Memory Computing Architecture", *IEEE Transactions on Circuits and Systems—I: Regular Papers,* vol. 67, No. 12, Dec. 2020 (pp. 4224-4232).

Korean Office Action Issued on Feb. 20, 2025, in Counterpart Korean Patent Application No. 10-2021-0051857 (4 Pages in English, 8 Pages in Korean).

* cited by examiner

| | t=0 | t=1 | t=2 | t=3 |
|---|---|---|---|---|
| Input | A0 | A1 | A2 | A3 |
| XBAR0 Output (W00) | A0W00 | A1W00 | A2W00 | A3W00 |
| XBAR1 Output (W01) | A0W01 | A0W00+ A1W01+ | A1W00+ A2W01+ | A2W00+ A3W01+ |
| XBAR2 Output (W02) | A0W02 | A0W01+ A1W02 | A0W00+ A1W01+ A2W02 | A1W00+ A2W01+ A3W02 |
| Final output | - | - | A0W00+ A1W01+ A2W02 | A1W00+ A2W01+ A3W02 |

IFM

| A0 | A1 | A2 | A3 |
|---|---|---|---|
| B0 | B1 | B2 | B3 |
| C0 | C1 | C2 | C3 |
| D0 | D1 | D2 | D3 |

Weight

| W00 | W01 | W02 |
|---|---|---|
| W10 | W11 | W12 |
| W20 | W21 | W22 |

APPARATUS AND METHOD WITH NEURAL NETWORK OPERATIONS

CROSS-REFERENCE TO RELATED APPLICATIONS

This application claims the benefit under 35 USC § 119(a) of Korean Patent Application No. 10-2021-0051857, filed on Apr. 21, 2021, in the Korean Intellectual Property Office, the entire disclosure of which is incorporated herein by reference for all purposes.

BACKGROUND

1. Field

The following description relates to an apparatus and method with neural network operations.

2. Description of Related Art

A neuromorphic processor may perform neural network operations. For example, a neuromorphic processor, including a neuron circuit and a synaptic circuit, may be implemented. Such a neuromorphic processor may be used as a neural network device to operate various neural networks (for example, a convolutional neural network (CNN), a recurrent neural network (RNN), or a feedforward neural network (FNN)) and may be utilized in fields including data classification or image recognition.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a neural network apparatus includes: a first processing circuit and a second processing circuit each configured to perform a vector-by-matrix multiplication (VMM) operation on a weight and an input activation; a first register configured to store an output of the first processing circuit; an adder configured to add an output of the first register and an output of the second processing circuit; a second register configured to store an output of the adder; and an input circuit configured to input a same input activation to the first processing circuit and the second processing circuit and control the first processing circuit and the second processing circuit.

Each of the first processing circuit and the second processing circuit may include: a read-write (RW) circuit configured to read and write the weight; a decoder configured to decode the input activation to an analog signal; an analog-to-digital converter (ADC) configured to convert an output activation into a digital signal; and one or more crossbar arrays configured to perform the VMM operation, the one or more crossbar arrays sharing the RW circuit, the decoder, and the ADC.

Each of the first processing circuit and the second processing circuit may be configured to perform the VMM operation using one crossbar array selected from the one or more crossbar arrays.

Each of the one or more crossbar arrays may include: a plurality of row lines; a plurality of column lines intersecting the plurality of row lines; and a plurality of memory cells arranged at intersections of the plurality of row lines and the plurality of column lines and configured to store weights included in a kernel.

The input circuit may include: an input feature map buffer configured to store an input feature map comprising the input activation; a control circuit configured to control the first processing circuit and the second processing circuit; and a weight read-write (RW) circuit configured to control the weights.

In another general aspect, a neural network apparatus includes: a plurality of processing circuits each configured to perform a vector-by-matrix multiplication (VMM) operation on a weight and a same input activation; an input circuit configured to input the input activation to the plurality of processing circuits and control the plurality of processing circuits, for each of a plurality of cycles; and an adder circuit configured to sequentially add outputs of the plurality of processing circuits.

The adder circuit may include: a first register configured to store an output of a first processing circuit among the plurality of processing circuits; an adder configured to add an output of the first register and an output of a second processing circuit among the plurality of processing circuits; and a second register configured to store an output of the adder.

The apparatus may include a post-processing circuit configured to perform post-processing on the output of the adder.

The apparatus may include a delay circuit configured to delay an output of the adder circuit and to input the output of the adder to the post-processing circuit.

Each of the plurality of processing circuits may include: a read-write (RW) circuit configured to read and write the weight; a decoder configured to decode the input activation to an analog signal; an analog-to-digital converter (ADC) configured to convert an output activation into a digital signal; and one or more crossbar arrays configured to perform the VMM operation, the one or more crossbar arrays sharing the RW circuit, the decoder, and the ADC.

Each of the plurality of processing circuits may be configured to perform the VMM operation using one crossbar array selected from the one or more crossbar arrays.

Each of the one or more crossbar arrays may include: a plurality of row lines; a plurality of column lines intersecting the plurality of row lines; and a plurality of memory cells arranged at intersections of the plurality of row lines and the plurality of column lines and configured to store weights included in a kernel.

The input circuit may include: an input feature map buffer configured to store an input feature map comprising the input activation; a control circuit configured to control the plurality of processing circuits; and a weight read-write (RW) circuit configured to control the weight.

In another general aspect, an operating method of a neural network apparatus includes: inputting a first input activation to a first processing circuit and a second processing circuit; storing a first partial sum output from the first processing circuit in a register, the first partial sum corresponding to the first input activation; inputting a second input activation to the first processing circuit and the second processing circuit; and inputting, to an adder, a second partial sum output from the second processing circuit and the first partial sum output from the register, the second partial sum corresponding to the second input activation.

Each of the first processing circuit and the second processing circuit may be configured to perform a vector-by-matrix multiplication (VMM) operation on a weight and an input activation.

Each of the first processing circuit and the second processing circuit may include: a read-write (RW) circuit configured to read and write a weight; a decoder configured to decode an input activation to an analog signal; an analog-to-digital converter (ADC) configured to convert an output activation into a digital signal; and one or more crossbar arrays configured to perform a VMM operation, the one or more crossbar arrays sharing the RW circuit, the decoder, and the ADC.

Each of the first processing circuit and the second processing circuit may be configured to perform the VMM operation using one crossbar array selected from the one or more crossbar arrays.

Each of the one or more crossbar arrays may include: a plurality of row lines; a plurality of column lines intersecting the plurality of row lines; and a plurality of memory cells arranged at intersections of the plurality of row lines and the plurality of column lines and configured to store weights included in a kernel.

The method may include inputting an output of the adder to a post-processing circuit configured to perform post-processing.

The method may include delaying, using a delay circuit, the output of the adder and inputting the output of the adder to the post-processing circuit.

In one general aspect, one or more embodiments include a non-transitory computer-readable storage medium storing instructions that, when executed by a processor, configure the processor to perform any one, any combination, or all operations and methods described herein.

In another general aspect, a neural network apparatus includes: an input circuit configured to input, in a current cycle, a same input activation to a plurality of processing circuits each comprising a crossbar array; and the plurality of processing circuits, each configured to output, in the current cycle, a multiplication operation result based on the same input activation and a weight corresponding to the crossbar array of the processing circuit.

For each of the plurality of processing circuits, the input circuit may be configured to select, as the crossbar array, a crossbar array corresponding to the current cycle among crossbar arrays of the processing circuit.

The apparatus may include an adder configured to output, in the current cycle, a sum of an output of an adder from a previous cycle and an output of one of the processing circuit in the current cycle.

The apparatus may be an electronic system configured to generate a recognition signal based on the outputs of the processing circuits.

Other features and aspects will be apparent from the following detailed description, the drawings, and the claims.

Figure 1:
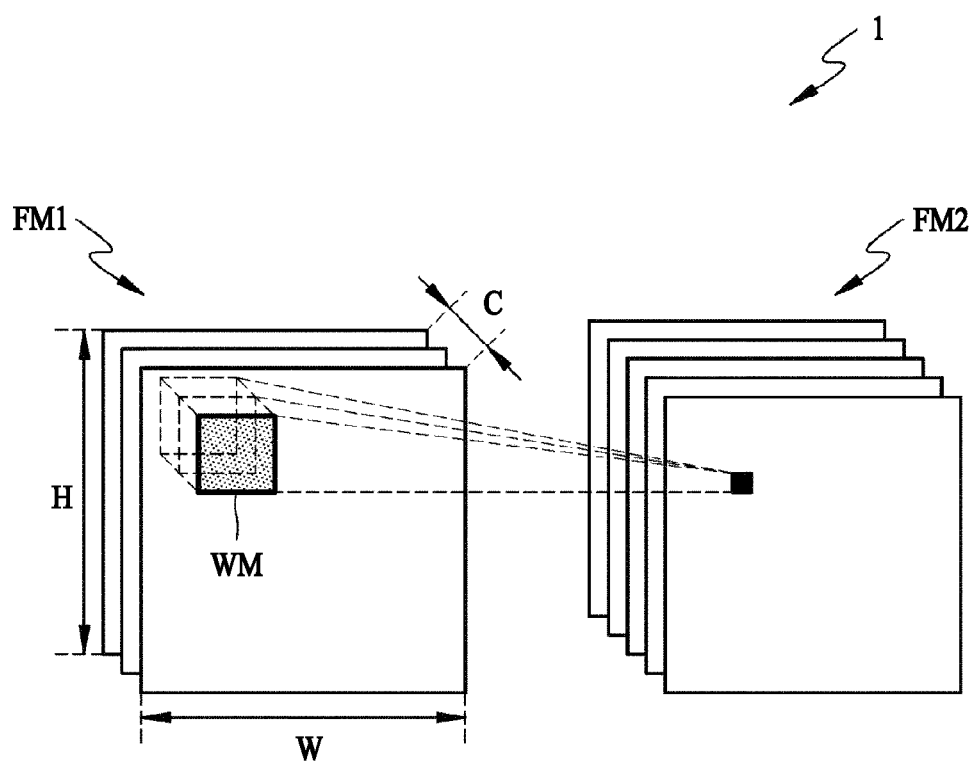
FIG. 1 illustrates an example of an architecture of a neural network.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art, after an understanding of the disclosure of this application, may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The following structural or functional descriptions of examples disclosed in the present disclosure are merely intended for the purpose of describing the examples and the examples may be implemented in various forms. The examples are not meant to be limited, but it is intended that various modifications, equivalents, and alternatives are also covered within the scope of the claims.

Although terms of "first" or "second" are used to explain various members, components, regions, layers, or sections, these members, components, regions, layers, or sections are not limited by these terms. Rather, these terms should be used only to distinguish one member, component, region, layer, or section from another member, component, region, layer, or section. For example, a "first" member, component, region, layer, or section referred to in examples described herein may also be referred to as a "second" member, component, region, layer, or section without departing from the teachings of the examples.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only and is not to be limiting of the examples. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof. The use of the term "may" herein with respect to an example or embodiment (for example, as to what an example or embodiment may include or implement) means that at least one example or embodiment exists where such a feature is included or implemented, while all examples are not limited thereto.

Unless otherwise defined, all terms used herein including technical or scientific terms have the same meanings as those generally understood consistent with and after an understanding of the present disclosure. Terms, such as those defined in commonly used dictionaries, should be construed to have meanings matching with contextual meanings in the relevant art and the present disclosure, and are not to be construed as an ideal or excessively formal meaning unless otherwise defined herein.

Hereinafter, examples will be described in detail with reference to the accompanying drawings. When describing the examples with reference to the accompanying drawings, like reference numerals refer to like components and a repeated description related thereto will be omitted.

FIG. 1 illustrates an example of an architecture of a neural network.

A neural network 1 may be represented as a mathematical model using nodes and edges. The neural network 1 may be, for example, an architecture of a deep neural network (DNN), or an n-layer neural network. The DNN or the n-layer neural network may correspond to, for example, a convolutional neural network (CNN), a recurrent neural network (RNN), a deep belief network, and/or a restricted Boltzmann machine. For example, the neural network 1 may be implemented as a CNN, but is not limited thereto. The neural network 1 of FIG. 1 may correspond to a portion of layers of a CNN. For example, the neural network 1 may correspond to a convolutional layer, a pooling layer, or a fully connected layer of the CNN. In the following description, for convenience of description, the neural network 1 may correspond to a convolutional layer of the CNN, however, examples are not limited thereto.

In the convolutional layer, a first feature map FM1 may correspond to an input feature map, and a second feature map FM2 may correspond to an output feature map. For example, the first feature map FM1 may be a set of data representing various features of input data, and the second feature map FM2 may be a data set representing various features of output data resulting from convolution operations being performed by applying a weight map WM to the first feature map FM1. The first feature map FM1 and the second feature map FM2 may be high-dimensional matrices of two or more dimensions, and each may include activation parameters. When the first feature map FM1 and the second feature map FM2 are, for example, three-dimensional (3D) feature maps, each of the first feature map FM1 and the second feature map FM2 may have a width W (referred to as a "column"), a height H (referred to as a "row"), and a depth C. The depth C may correspond to a number of channels.

In the convolution operation performed on the first feature map FM1 and the weight map WM to generate the second feature map FM2, the weight map WM may be used to filter the first feature map FM1, and may be referred to as a "weight filter" or a "weight kernel". In an example, a depth (i.e., a number of channels) of the weight map WM may be equal to a depth (i.e., a number of channels) of the first feature map FM1. The weight map WM may be shifted to traverse the first input feature map FM1 in a sliding window manner. For each shift, each of weights included in the weight map WM may be multiplied and added by all feature values in an overlapping area between the weight map WM and the first feature map FM1. In response to the convolution operation between the first feature map FM1 and the weight map WM being performed, one channel of the second feature map FM2 may be generated.

Although one weight map WM is shown in FIG. 1, a plurality of weight maps may be convolved with the first feature map FM1 to generate a plurality of channels of the second feature map FM2. The second feature map FM2 of the convolutional layer may be an input feature map of a next layer. For example, the second feature map FM2 may be an input feature map of a pooling layer, or the second feature map FM2 may be an input feature map of a subsequent convolutional layer. However, examples are not limited thereto.

Figure 2:
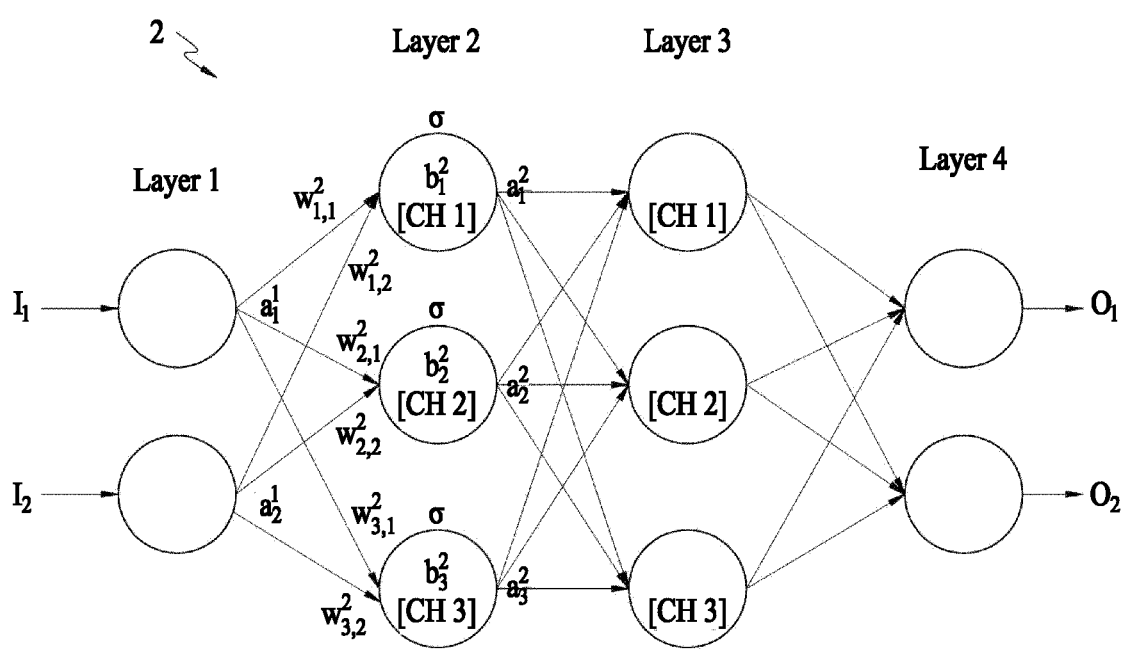
FIG. 2 illustrates an example of an operation performed in a neural network.

FIG. 2 illustrates an example of an operation performed in a neural network.

Referring to FIG. 2, a neural network 2 may have a structure of including an input layer, hidden layers, and an output layer, may perform an operation based on received input data, for example, $I_1$ and $I_2$, and may generate output data, for example, $O_1$ and $O_2$, based on a result of the operation.

The neural network 2 may be, for example, a DNN or an n-layer neural network including two or more hidden layers, as described above. In the example of FIG. 2, the neural network 2 may be a DNN that includes an input layer 1, two hidden layers Layer 2 and Layer 3, and an output layer 4. When the neural network 2 is implemented as an architecture of a DNN, a larger number of layers that may process valid information may be included, so that the neural network 2 may process more complicated data sets than a neural network with a single layer. The neural network 2 includes four layers as shown in FIG. 2, but this is merely an example. For example, the neural network 2 may include more or fewer layers than the four layers, or more or fewer channels than those shown in FIG. 2. In other words, the neural network 2 may include layers having various structures different from a structure illustrated in FIG. 2.

Each of the layers included in the neural network 2 may include a plurality of channels, where each of the channels may include or represent a plurality of artificial nodes known as neurons, processing elements (PEs), units, or similar terms, configured to process data of the corresponding channel. While the nodes may be referred to as "artificial nodes" or "neurons," such reference is not intended to impart any relatedness with respect to how the neural network architecture computationally maps or thereby intuitively recognizes information and how a human's neurons operate. I.e., the terms "artificial nodes" or "neurons" are merely terms of art referring to the hardware implemented nodes of a neural network. As shown in FIG. 2, the input layer 1 may include two channels (nodes), and each of the hidden layers Layer 2 and Layer 3 may include three channels (nodes). However, this is merely an example, and each of the layers included in the neural network 2 may include other numbers of channels (nodes).

Channels in each of the layers of the neural network 2 may be connected to each other to process data. For example, one channel may receive data from other channels, may perform an operation on the data, and may output an operation result to the other channels.

An output value of a channel may be referred to as an activation, or a value which results from such a predetermined activation function of the corresponding channel. An input and an output of each of the channels may be referred to as an "input activation" and an "output activation", respectively. In other words, an activation may be a parameter corresponding to an output of one channel and may also correspond to inputs of the channels included in a next layer, due to corresponding connection(s) with the next layer. Each of the channels may determine its activation based on weights and activations received from channels included in a previous layer. A weight may be a value assigned to a connection relationship between the channels, as a parameter to be used for calculating an output activation of each of the channels. For example, an output from a previous layer's channel may be provided to as an input to a channel of a next or subsequent layer through a weighted connection between the previous layer's channel and the channel of the next layer, with the weight of the weighted connection being variously adjusted during the training of the neural network until the neural network is trained for a desired objective. There may be additional connections to the channel of the next layer, such as for providing a bias connection value through a connection that may or may not be weighted and/or for providing the above example recurrent connection which may be weighted. During training and implementation such connections and connection weights may be selectively implemented, removed, and varied to generate or obtain a resultant neural network that is thereby trained and that may be correspondingly implemented for the trained objective, such as for any of the above example recognition objectives.

Accordingly, each of channels, or representative nodes of such a channel, may be processed by a computational unit or a processing element (e.g., a PE) that receives an input (e.g., through, or by further considering, such weighted connections) and outputs an output activation, and an input and an output of each of the channels may be mapped. The computational unit may be configured to perform the activation function for a node. As a non-limiting example, when $\sigma$ is an activation function, $w_{jk}^i$ is a weight from a k-th channel included in an (i−1)-th layer to a j-th channel included in an i-th layer, $b_j^i$ is bias of the j-th channel in the i-th layer, and $a_j^i$ an activation of the j-th channel in the i-th layer, the activation $a_j^i$ may be calculated using Equation 1 below.

$$a_j^i = \sigma\left(\sum_k \left(w_{jk}^j \times a_k^{i-1}\right) + b_j^i\right)$$

Equation 1

As shown in FIG. 2, an activation of a first channel CH 1 of a second layer (that is, the hidden layer 2) may be denoted by $a_1^2$. Also, the activation $a_1^2$ may have a value of $a_1^2=\sigma(w_{1,1}^2 \times a_1^1 + w_{1,2}^2 \times a_2^1 + b_1^2)$ according to Equation 1. The activation function $\sigma$ may be a rectified linear unit (ReLU), but is not limited thereto. For example, the activation function $\sigma$ may be a sigmoid function, a hyperbolic tangent (tanh) function, or a maxout function.

As described above, in the neural network 2, a large number of data sets may be exchanged between a plurality of channels interconnected with one another, and may undergo a computation process through layers. In the above computation process, a large number of multiply-accumulate (MAC) operations may be performed, and a large number of memory access operations for loading an activation and a weight which are operands of a MAC operation at an appropriate time may need to be performed together.

A general or typical digital computer may use a Von Neumann structure in which a computational unit and a memory are separated and that includes a common data bus for data transmission between two separate blocks. Accordingly, in a process of operating the neural network 2 in which computation and transmission of data are continuously repeated, a large amount of time may be used for data transmission, and excessive power may be consumed using the typical digital computer. To overcome such technological problems, an in-memory computing circuit of one or more embodiments may be provided as an architecture for integrating a computational unit and a memory to perform a MAC operation, thereby reducing an amount of time that may be used for data transmission and reducing power consumption. Hereinafter, an example of an in-memory computing circuit will be described in detail with reference to FIG. 3.

Figure 3:
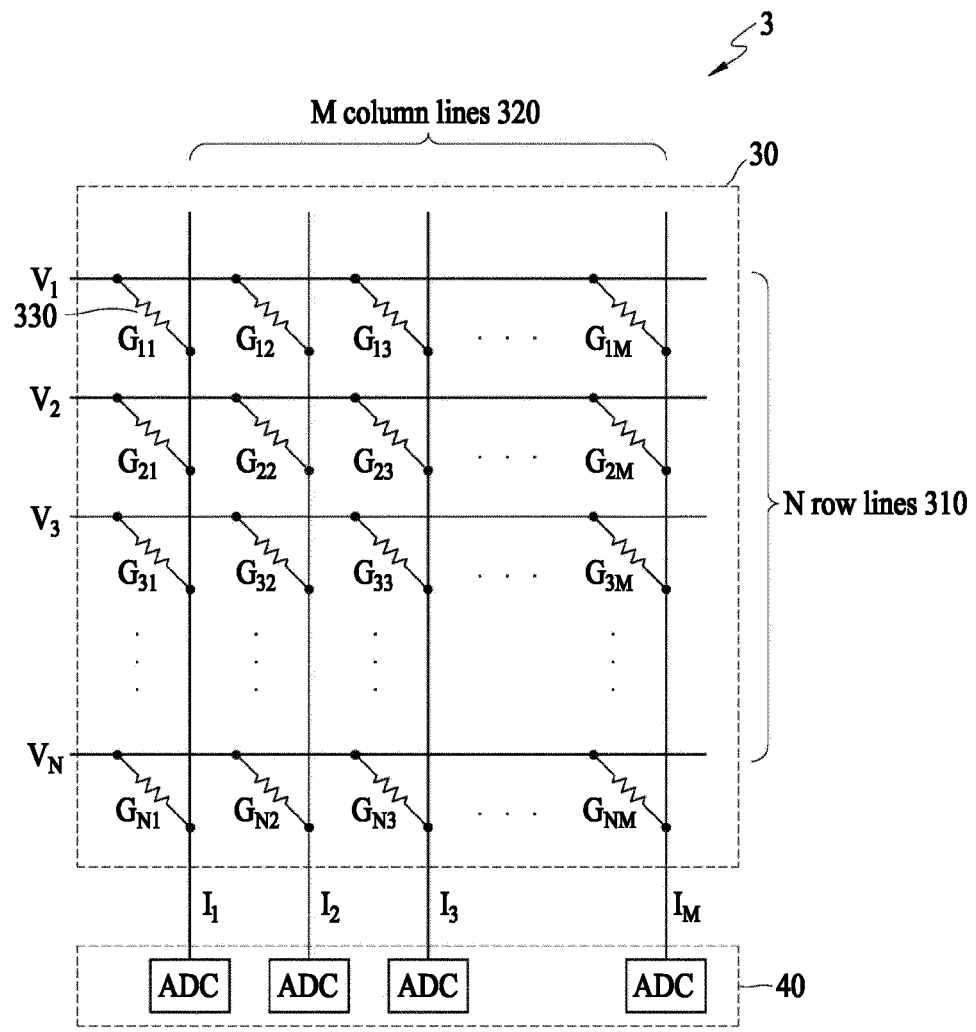
FIG. 3 illustrates an example of an in-memory computing circuit.

FIG. 3 illustrates an example of an in-memory computing circuit.

Referring to FIG. 3, an in-memory computing circuit 3 may include an analog crossbar array 30, and one or more analog-to-digital converters (ADCs) 40. Although components of the in-memory computing circuit 3 associated with examples are illustrated in FIG. 3, it will be apparent after an understanding of the present disclosure that the in-memory computing circuit 3 may further include components other than the components illustrated in FIG. 3.

The analog crossbar array 30 may include a plurality of row lines 310, a plurality of column lines 320, and a plurality of memory cells 330. The plurality of row lines 310 may be used to receive input data. For example, when the plurality of row lines 310 are "N" row lines, voltages, for example, voltages $V_1$, $V_2$, and $V_N$, corresponding to input activations may be applied to the "N" row lines. The plurality of column lines 320 may intersect the plurality of row lines 310. When the plurality of column lines 320 are "M" column lines, the plurality of column lines 320 and the plurality of row lines 310 may intersect at "N×M" intersections. In this example, "N" and "M" may be arbitrary natural numbers.

The plurality of memory cells 330 may be arranged at the intersections of the plurality of row lines 310 and the plurality of column lines 320. Each of the plurality of memory cells 330 may be implemented as a non-volatile memory, for example, a resistive random-access memory (ReRAM), a magnetic random-access memory (MRAM), or eFlash, to store weights, but is not limited thereto. Each of the plurality of memory cells 330 may be, for example, a volatile memory such as a static random-access memory (SRAM).

As shown in FIG. 3, the plurality of memory cells 330 may have conductances $G_{11}$ to $G_{NM}$ corresponding to weights. If a voltage corresponding to an input activation is applied to each of the plurality of row lines 310, a current having a magnitude of "I=V×G" may be output through each of the memory cells 330 according to Ohm's law. Currents output from memory cells arranged along one column line may be combined, and accordingly a sum of currents $I_1$ to $I_M$ may be output along the plurality of column lines 320. The sum of the currents $I_1$ to $I_M$ may correspond to a result of a MAC operation performed in an analog manner.

The one or more ADCs 40 may convert a result (for example, the sum of the currents $I_1$ to $I_M$) of the analog MAC operation output from the analog crossbar array 30 into a digital signal. A result of the MAC operation converted into the digital signal may be output from the one or more ADCs 40 and may be used in a subsequent neural network operation process.

As shown in FIG. 3, the in-memory computing circuit 3 of one or more embodiments may have a relatively low complexity of a core computational unit, may consume a relatively small amount of power, and may be small in size, in comparison to a typical digital computer. However, in a process of mapping synaptic weights connected to thousands and tens of thousands of neurons of a neural network model to the in-memory computing circuit 3, constraints on a physical size may occur. According to examples, using the in-memory computing circuit 3 of one or more embodiments having various advantages while satisfying the constraints on the physical size, a neural network apparatus may operate a neural network at low power. Hereinafter, non-limiting examples of an efficient structure and an operating method of a neural network apparatus of one or more embodiments will be described in detail with reference to the drawings.

Figure 4:
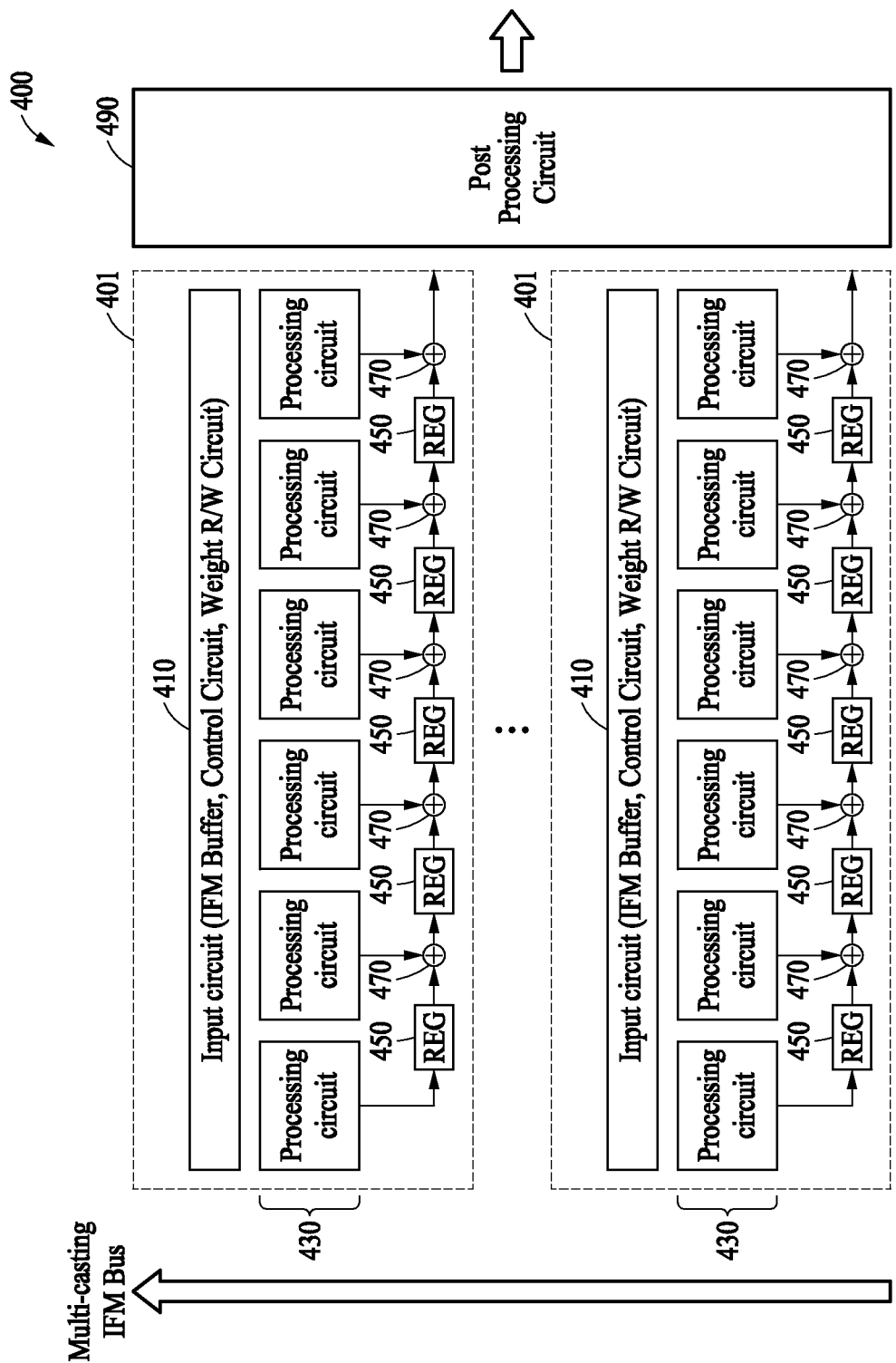
FIG. 4 illustrates an example of a neural network apparatus.

FIG. 4 illustrates an example of a neural network apparatus.

A neural network apparatus 400 may perform a neural network operation. The neural network apparatus 400 may include one or more processing elements 401. The neural network apparatus 400 may further include a multicasting input feature map (IFM) bus configured to transmit data to each of the processing elements 401, and a post-processing circuit configured to perform post-processing by receiving an output of each of the processing elements 401.

Each of the processing elements 401 may include an input circuit 410, a processing circuit 430, a register 450, and an adder 470. For example, one processing element 401 may include one input circuit 410, a plurality of processing circuits 430 connected to the one input circuit 410, and a plurality of registers 450 and a plurality of adders 470 that are connected to the plurality of processing circuits 430. In other words, the plurality of processing circuits 430 included in the one processing element 401 may share the one input circuit 410.

Although one processing element 401 includes six processing circuits 430 as shown in FIG. 4, examples are not limited thereto. A processing element 401 may include an appropriate number of processing circuits 430 based on a neural network operation to be performed.

The input circuit 410 may input the same input activation to the plurality of processing circuits 430. The input circuit 410 may input an activation included in an input feature map to the plurality of processing circuits 430 in an order in which operations are to be performed, for each cycle.

The processing circuit 430 may include one or more crossbar arrays. The processing circuit 430 may perform a vector-by-matrix multiplication (VMM) operation on a weight and an input activation, using a crossbar array.

The processing circuit 430 may output a partial sum to the adder 470. The adder 470 may add an output of the register 450 and an output of the processing circuit 430 and may store a sum of the outputs in a next register 450. For each cycle, outputs of the plurality of processing circuits 430 may be sequentially added and stored in a next register 450. Finally, all the outputs of the processing circuits 430 may be added and transferred to the post-processing circuit 490. A circuit in which the register 450 and the adder 470 are sequentially connected may also be referred to as an "adder circuit".

A portion of the processing circuits 430 may be activated, and the other processing circuits 430 may be deactivated. For example, three processing circuits 430 among the processing circuits 430 may be activated to perform an operation, and the other three processing circuits 430 may be deactivated. The deactivated processing circuits 430 may recognize "0" as outputs, to have the same effect as a bypass. In this example, outputs of the activated processing circuits 430 may be added.

The plurality of processing circuits 430 may share one input circuit 410, and thus the neural network apparatus 400 of one or more embodiments may increase a spatial efficiency of elements in the neural network apparatus 400. In addition, an output of one processing circuit 430 and an output of a neighboring processing circuit 430 may be sequentially added, and thus the neural network apparatus 400 of one or more embodiments may reduce routing complexity of the neural network apparatus 400.

Figure 5:
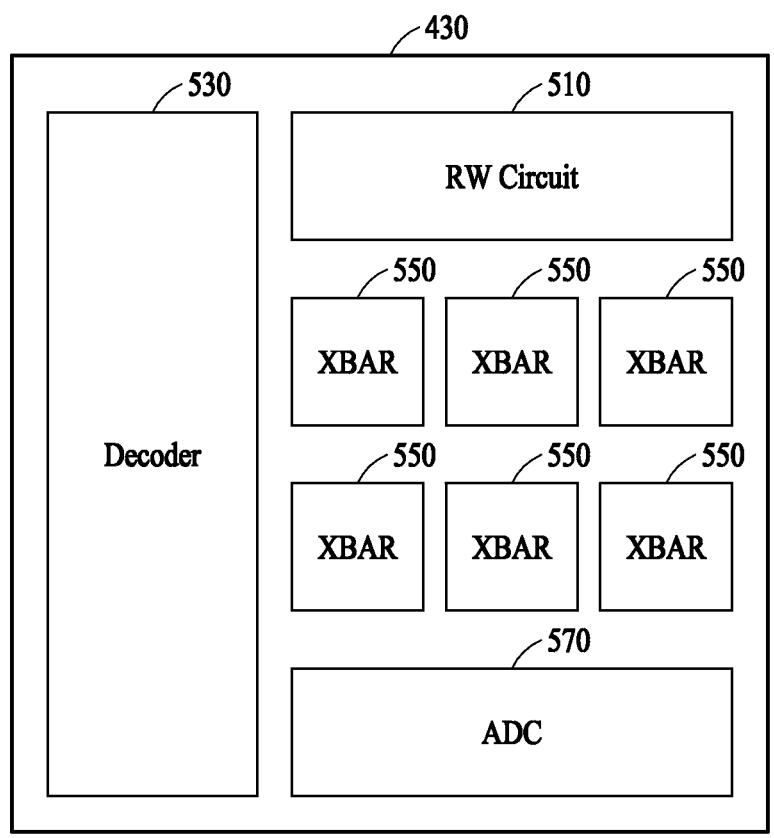
FIG. 5 illustrates an example of a processing circuit.

FIG. 5 illustrates an example of a processing circuit (e.g., one of the processing circuits 430 of FIG. 4).

Referring to FIG. 5, a processing circuit 430 may include a read-write (RW) circuit 510, a decoder 530, one or more crossbar arrays 550, and an ADC 570. The one or more crossbar arrays 550 may share the RW circuit 510, the decoder 530, and the ADC 570.

The processing circuit 430 may perform a MAC operation using one crossbar array 550 selected from the one or more crossbar arrays 550. One of the one or more crossbar arrays 550 to perform an operation in a predetermined cycle may be activated.

The RW circuit 510 may read and write a weight value of a crossbar array 550 included in the processing circuit 430. The decoder 530 may control an input and an output of an input activation and may decode the input activation to an analog signal. The ADC 570 may convert an output activation into a digital signal.

Figure 6:
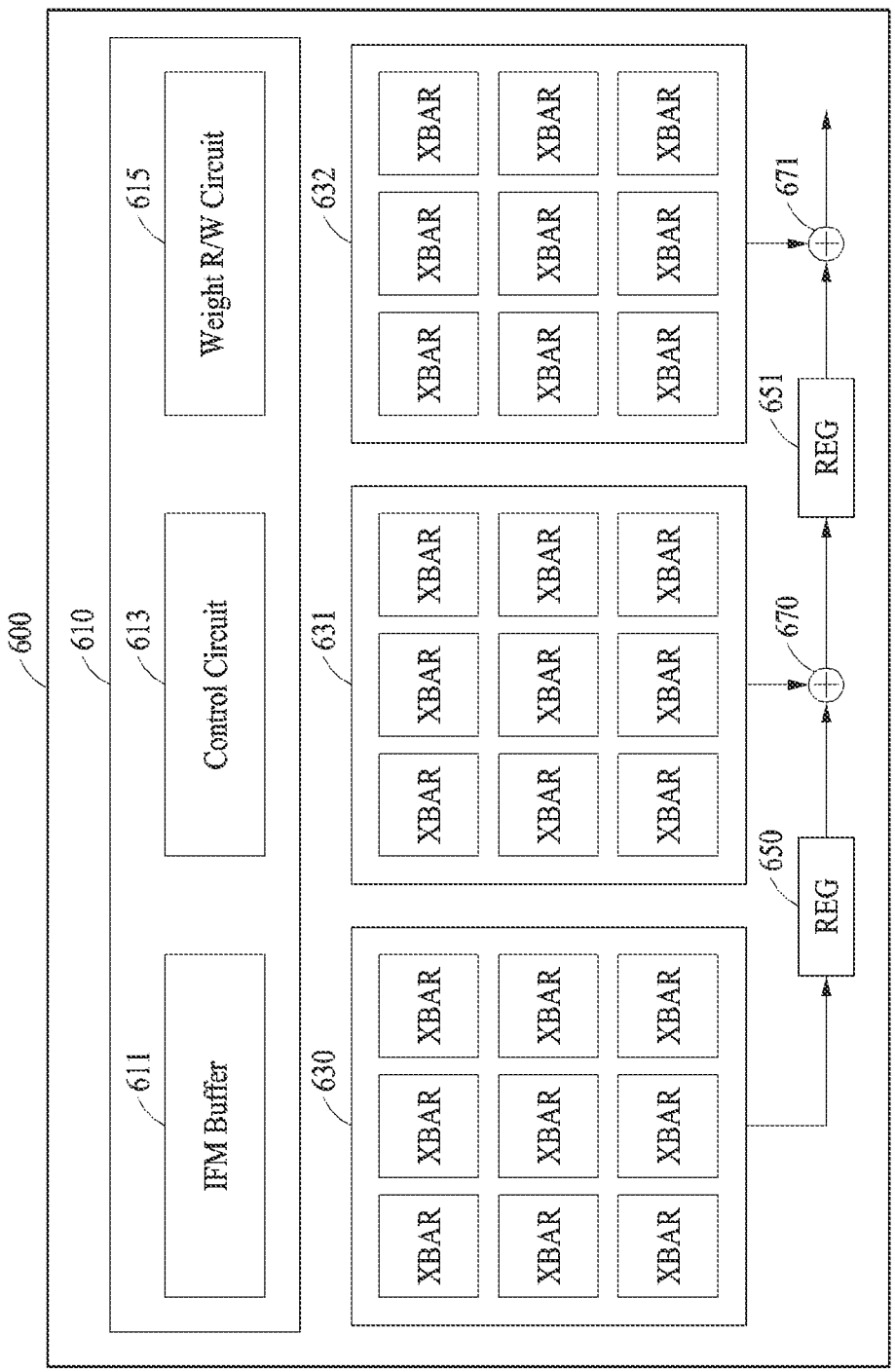
FIG. 6 illustrates an example of a processing element of a neural network apparatus.

FIG. 6 illustrates an example of a processing element of a neural network apparatus (e.g., a processing element 401 of the neural network apparatus 400 of FIG. 4).

Referring to FIG. 6, a processing element 600 may include an input circuit 610, a first processing circuit 630, a second processing circuit 631, a third processing circuit 632, a first register 650, a second register 651, a first adder 670, and a second adder 671. For example, the processing element 600 may correspond to the processing element 401 of FIG. 4. In an example, the input circuit 610 may correspond to the input circuit 410, the first processing circuit 630 to the third processing circuit 632 may correspond to the processing circuits 430, the first register 650 and the second register 651 may correspond to the registers 450, and the first adder 670 and the second adder 671 may correspond to the adders 470.

Although the processing element 600 includes three processing circuits (that is, the first processing circuit 630 to the third processing circuit 632) as shown in FIG. 6, examples are not limited thereto. A number of processing circuits may be determined based on a size of a kernel used for a neural network operation. For example, the processing element 600 of FIG. 6 may perform an operation corresponding to a kernel with a width or a height of "3" and each output may be a result of the operation corresponding to a "1×3" or "3×1" kernel.

The input circuit 610 may include an input feature map (IFM) buffer 611, a control circuit 613, and a weight RW circuit 615.

The IFM buffer 611 may perform buffering on an input feature map including an input activation. The control circuit 613 may control the first processing circuit 630 to the third processing circuit 632. The weight RW circuit 615 may read and write a weight value of each of crossbar arrays XBAR included in the first processing circuit 630 to the third processing circuit 632.

The first processing circuit 630, the second processing circuit 631, and the third processing circuit 632 may output operation results to the first register 650, the first adder 670, and the second adder 671, respectively. The first adder 670 may add an output of the first register 650 and an output of the second processing circuit 631 and may output a result of the addition to the second register 651. The second adder 671 may add an output of the second register 651 and an output of the third processing circuit 632 and may output a result of the addition. Depending on examples, a portion of the first processing circuit 630 to the third processing circuit 632 may be deactivated so that an output may be recognized as "0".

Figure 7:
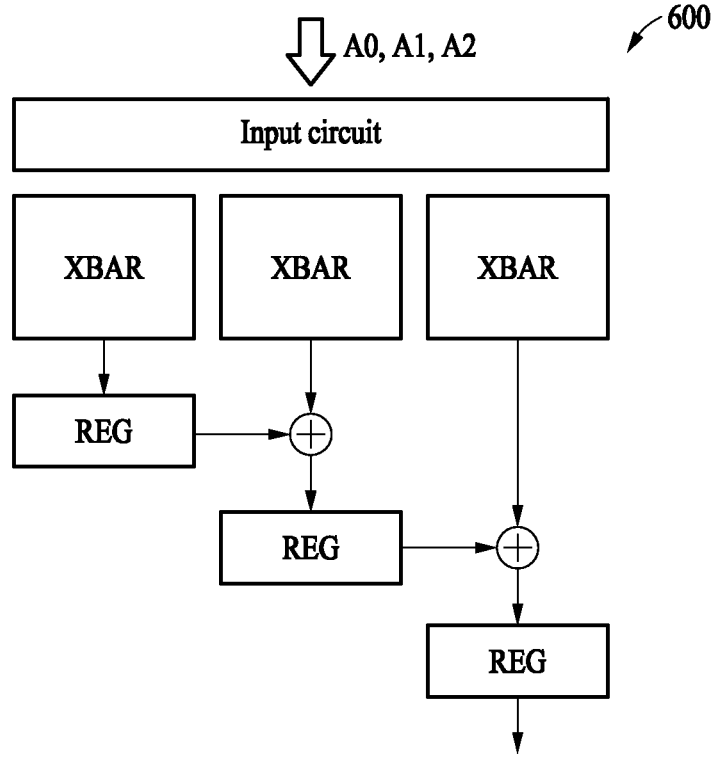
FIG. 7 illustrates an example of an operation of a processing element.

FIG. 7 illustrates an example of an operation of a processing element (e.g., the processing element 600 of FIG. 6).

FIG. 7 illustrates a neural network operation of the processing element 600 on weights and an input feature map IFM. Although the input feature map IFM is illustrated in a two-dimensional (2D) matrix in FIG. 7 for convenience of description, the input feature map IFM may have a channel with a size corresponding to a row of a crossbar array XBAR. In other words, the processing element 600 may perform a MAC operation on multiple channels.

Each of the first processing circuit 630 to the third processing circuit 632 may perform a MAC operation on an input activation and each of weights W00, W01 and W02.

In a first cycle (t=0), an activation A0 of the input feature map IFM may be input to the first processing circuit 630 to the third processing circuit 632. The first processing circuit 630 to the third processing circuit 632 may perform MAC operations to output activations A0W00, A0W01, and A0W02, respectively. For example, the first processing circuit 630 may output the activation A0W00 based on an operation between the activation A0 and the weight W00, the second processing circuit 631 may output the activation A0W01 based on an operation between the activation A0 and the weight W01, and the third processing circuit 632 may output the activation A0W02 based on an operation between the activation A0 and the weight W02. The first register 650 may store the activation A0W00 of the first processing circuit 630.

In a second cycle (t=1), an activation A1 of the input feature map IFM may be input to the first processing circuit 630 to the third processing circuit 632. The first processing circuit 630 to the third processing circuit 632 may perform MAC operations to output activations A1W00, A1W01, and A1W02, respectively. The first register 650 may output the activation A0W00 stored in the first cycle. The first adder 670 may add the activation A0W00 output from the first register 650 and the activation A1W01 output from the second processing circuit 631 and may output a sum of the activations A0W00 and A1W01 to the second register 651. The second register 651 may store the sum of the activations A0W00 and A1W01.

In a third cycle (t=2), an activation A2 may be input to the first processing circuit 630 to the third processing circuit 632. The first processing circuit 630 to the third processing circuit 632 may perform MAC operations to output activations A2W00, A2W01, and A2W02, respectively. The second register 651 may output the sum of the activations A0W00 and A1W01 stored in the second cycle. The second adder 671 may add the sum of the activations A0W00 and A1W01 output from the second register 651 and the activation A2W02 output from the third processing circuit 632, and may finally output a sum of the activations A0W00, A1W01 and A2W02.

While the above-described first to third cycles are similarly repeated, in a fourth cycle (t=3) in which an activation A3 is input to the first processing circuit 630 to the third processing circuit 632, a sum of activations A1W00, A2W01 and A3W02 may be finally output.

Figure 8:
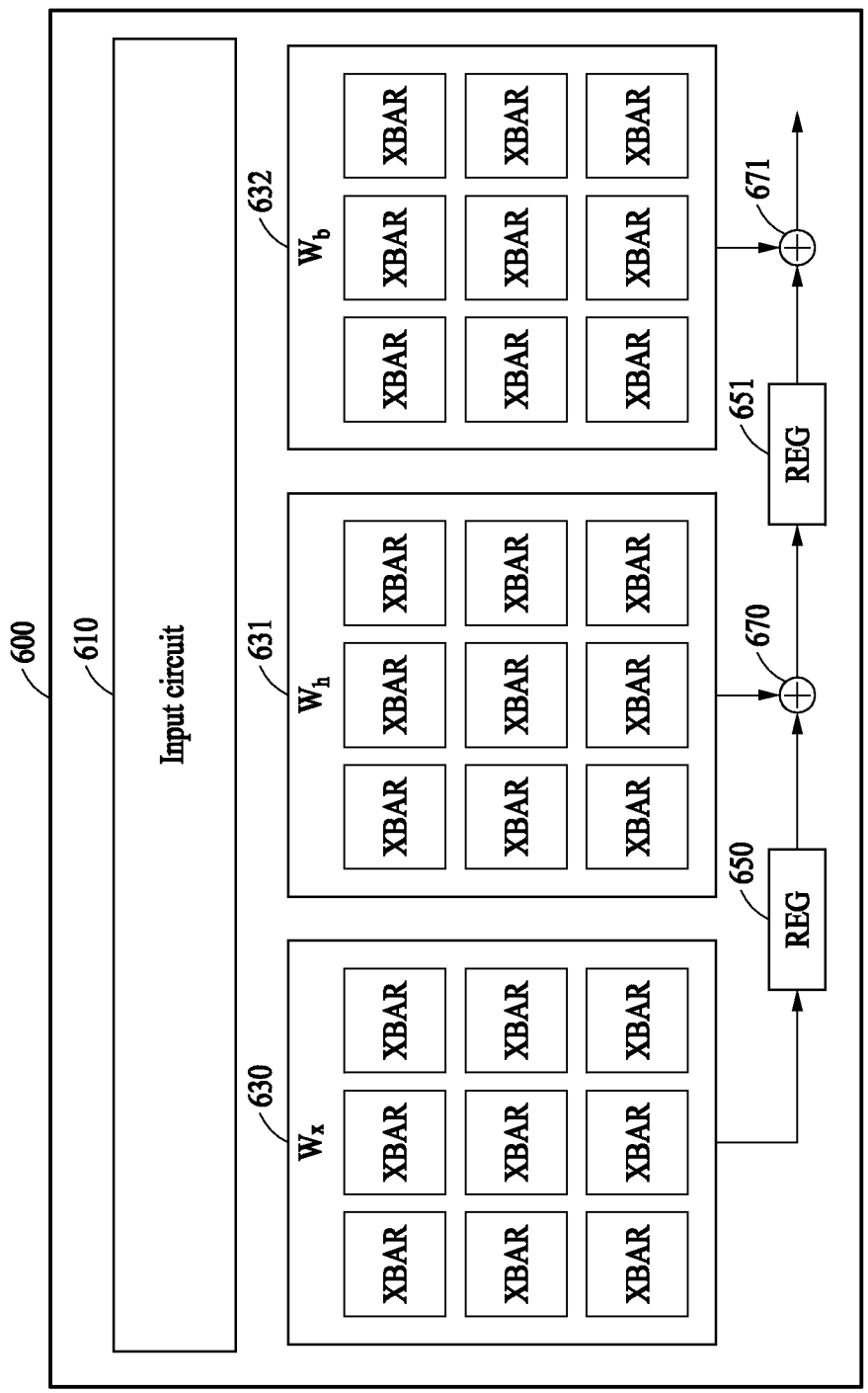
FIG. 8 illustrates an example of an operation of a processing element.

FIG. 8 illustrates an example of an operation of a processing element (e.g., the processing element 600 of FIG. 6).

In FIG. 8, the processing element 600 may perform an operation of a long short-term memory (LSTM). For example, the processing element 600 may perform an operation represented as shown in Equation 2 below.

$$f_t = \sigma(W_{xh\_f}x_t + W_{hh\_f}h_{t-1} + b_{h\_f})$$

$$i_t = \sigma(W_{xh\_i}x_t + W_{hh\_i}h_{t-1} + b_{h\_i})$$

$$o_t = \sigma(W_{xh\_o}x_t + W_{hh\_o}h_{t-1} + b_{h\_o})$$

$$g_t = \tanh(W_{xh\_g}x_t + W_{hh\_g}h_{t-1} + b_{h\_g})$$

$$c_t = f_t \odot c_{t-1} + i_t \odot g_{t-1}$$

$$h_t = o_t \odot \tanh(c_{t-1}) + i_t \odot g_{t-1}$$

The input circuit 610 may store a weight $W_{xh}$ in one of crossbar arrays included in the first processing circuit 630 and store a weight $W_{hh}$ in one of crossbar arrays included in the second processing circuit 631. The input circuit 610 may store a weight $W_b$ in one of crossbar arrays included in the third processing circuit 632. The weight $W_b$ may be defined so that a bias of each column may be calculated and output for an input vector including only "1".

The processing element 600 may perform an operation of calculating $f_t$, $i_t$, $o_t$ and $g_t$ in Equation 2 using crossbar arrays of the first processing circuit 630 to the third processing circuit 632 in which the weights $W_{xh}$, $W_{hh}$, and $W_b$ are stored. For example, the processing element 600 may store weights for calculating $f_t$, $i_t$, $o_t$ and $g_t$ in four crossbar arrays included in the first processing circuit 630 to the third processing circuit 632, respectively, may sequentially select the four crossbar arrays, and may perform the operation.

Figure 9:
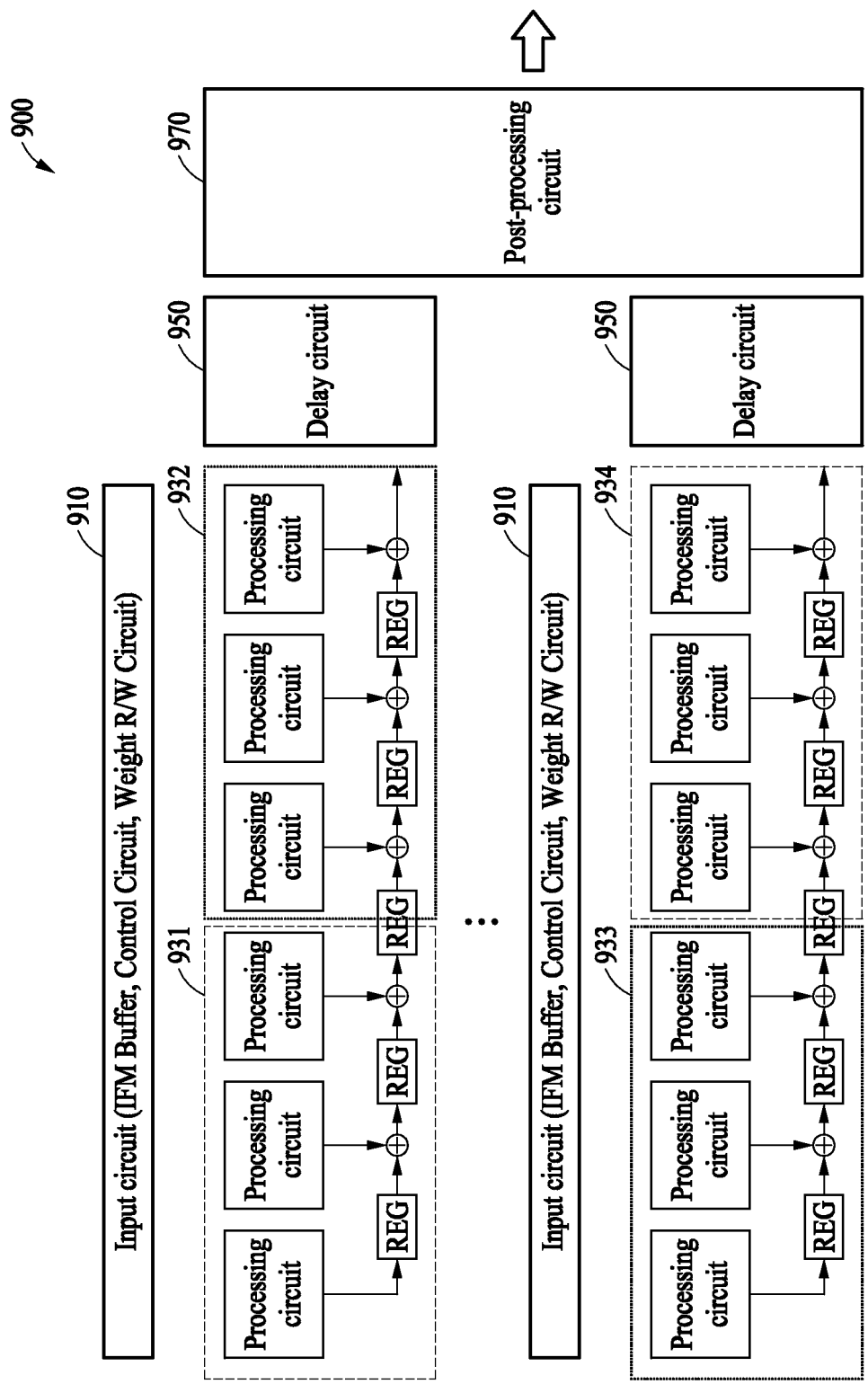
FIG. 9 illustrates an example of a neural network apparatus.

FIG. 9 illustrates an example of a neural network apparatus.

Referring to FIG. 9, a neural network apparatus 900 may include an input circuit 910, a first processing circuit group 931, a second processing circuit group 932, a third processing circuit group 933, a fourth processing circuit group 934, one or more delay circuits 950, and a post-processing circuit 970. The input circuit 910 and the post-processing circuit 970 may respectively correspond to the input circuit 410 and the post-processing circuit 490 of FIG. 4, for example. Also, processing circuits, registers and adders included in the first processing circuit group 931 to the fourth processing circuit group 934 may respectively correspond to the processing circuit 430, the register 450 and the adder 470 of FIG. 4, for example.

The delay circuit 950 may delay an output of a processing element and may input the output of the processing element to the post-processing circuit 970. The delay circuit 950 may delay an output of each of the first processing circuit group 931 to the fourth processing circuit group 934 by a predetermined cycle and may output the output to the post-processing circuit 970, and thus the neural network apparatus 900 of one or more embodiments may enhance an efficiency and a diversity of computations of the neural network apparatus 900. In an example, when the neural network apparatus 900 performs a 3×3 convolution operation using the first processing circuit group 931 and the fourth processing circuit group 934, that is, when the second processing circuit group 932 and the third processing circuit group 933 are deactivated, a delay corresponding to six cycles may occur in the first processing circuit group 931, and a delay corresponding to three cycles may occur in the fourth processing circuit group 934. In this example, the delay circuit 950 may synchronize results of operations performed by the first processing circuit group 931 and the fourth processing circuit group 934 and may transmit the synchronized results to the post-processing circuit 970. In another example, when the second processing circuit group 932 and the third processing circuit group 933 are selected, the delay circuit 950 may also perform the same function as described above.

Figure 10:
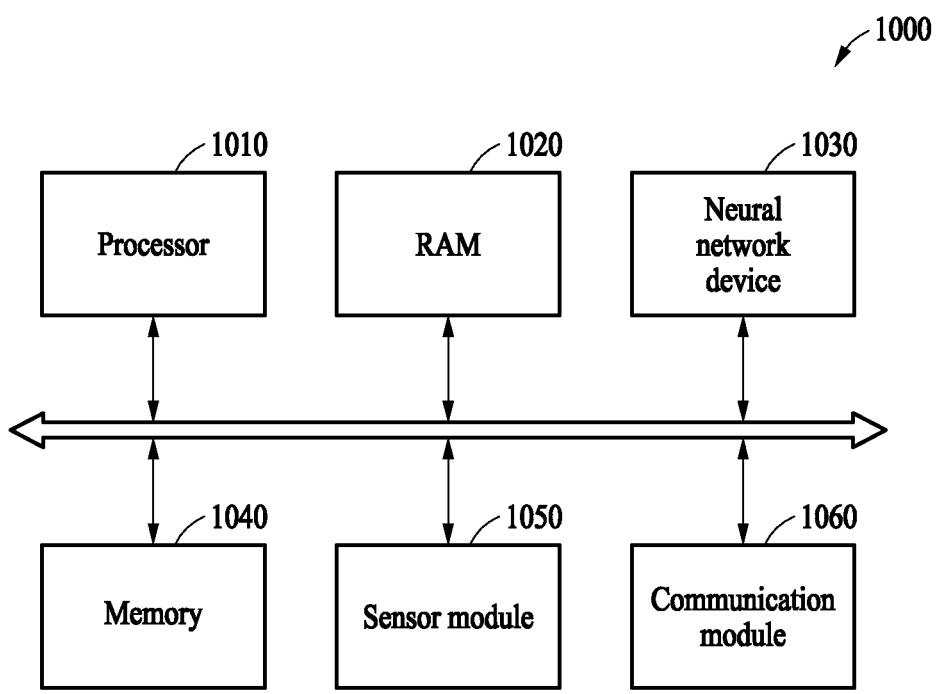
FIG. 10 illustrates an example of a configuration of an electronic system.

FIG. 10 illustrates an example of a configuration of an electronic system.

In FIG. 10, an electronic system 1000 may extract valid information by analyzing input data in real time based on a neural network, and may perform a situation determination or control configurations of an electronic device including the electronic system 1000, based on the extracted information. For example, the electronic system 1000 may be, or be applied to, a drone, a robotic apparatus such as an advanced driver-assistance system (ADAS), a smart television (TV), a smartphone, a medical device, a mobile device, an image display device, a measurement device, and/or an Internet of things (IoT) device, and may also be mounted on, one or more of various other types of electronic devices.

Referring to FIG. 10, the electronic system 1000 may include a processor 1010 (e.g., one or more processors), a RAM 1020, a neural network device 1030, a memory 1040 (e.g., one or memories), a sensor module 1050, and a communication module 1060. The electronic system 1000 may further include an input/output module, a security module, and a power controller. A portion of hardware configurations of the electronic system 1000 may be mounted on at least one semiconductor chip.

The processor 1010 may control an overall operation of the electronic system 1000. The processor 1010 may include a single processor core, or may include a plurality of processor cores (multi-core). The processor 1010 may process or execute programs and/or data stored in the memory 1040. In an example, the processor 1010 may control a function of the neural network device 1030 by executing the programs stored in the memory 1040. The processor 1010 may be implemented as, for example, a central processing unit (CPU), a graphics processing unit (GPU), or an application processor (AP).

The RAM 1020 may temporarily store programs, data, or instructions. For example, the programs and/or data stored in the memory 1040 may be temporarily stored in the RAM 1020 according to a booting code or a control of the processor 1010. The RAM 1020 may be implemented as, for example, a memory such as a dynamic random-access memory (DRAM) or an SRAM.

The neural network device 1030 may perform a neural network operation based on received input data and may generate an information signal based on a result obtained by performing the neural network operation. The neural network may include, but is not limited to, for example, a CNN, an RNN, a deep belief network, or a restricted Boltzmann machine. The neural network device 1030 may be a neural network dedicated hardware accelerator or a device including the neural network dedicated hardware accelerator, and may correspond to, for example, the neural network apparatus 400 described above with reference to FIGS. 4 to 7.

The neural network device 1030 may control a plurality of crossbar arrays to share and process same input data using a shift register circuit, and may select at least a portion of operation results output from the plurality of crossbar arrays. Also, the neural network device 1030 may obtain a final output by accumulating and adding the selected operation results in units of a preset number of cycles. Accordingly, the electronic system 1000 of one or more embodiments may increase a number of times an input is reused, and thus may decrease a number of memory accesses. Thus, the electronic system 1000 of one or more embodiments may decrease an amount of power to be consumed to operate the neural network device 1030.

The information signal may include one of various types of recognition signals such as a voice recognition signal, an object recognition signal, an image recognition signal, or a biometric information recognition signal. For example, the neural network device 1030 may receive frame data included in a video stream as input data and may generate a recognition signal about an object included in an image represented by the frame data from the frame data. However, examples are not limited thereto, and the neural network device 1030 may receive various types of input data depending on the type or function of an electronic device including the electronic system 1000 and may generate a recognition signal according to the input data.

The memory 1040 may be a storage for storing data and may store an operating system (OS), various programs, and a variety of data. In an example, the memory 1040 may store intermediate results generated in a process of performing an operation of the neural network device 1030.

The memory 1040 may be a DRAM, but is not limited thereto. The memory 1040 may include, for example, at least one of a volatile memory and a non-volatile memory. The non-volatile memory may include, for example, a read-only memory (ROM), a programmable read-only memory (PROM), an erasable programmable read-only memory (EPROM), an electrically erasable programmable read-only memory (EEPROM), a flash memory, a phase-change random-access memory (PRAM), an MRAM, a resistive random-access memory (RRAM), or a ferroelectric random-access memory (FRAM). The volatile memory may include, for example, a DRAM, an SRAM, a synchronous dynamic random-access memory (SDRAM), a PRAM, an MRAM, an RRAM, or a FRAM. In an example, the memory 1040 may include any one or any combination of any two or more of a hard disk drive (HDD), a solid-state drive (SSD), a CompactFlash (CF) card, a Secure Digital (SD) card, a Micro Secure Digital (microSD) card, a Mini Secure Digital (miniSD) card, an eXtreme Digital Picture (xD-Picture) card, and a Memory Stick.

The sensor module 1050 may collect information about a surrounding of an electronic device including the electronic system 1000. The sensor module 1050 may sense or receive signals (for example, image signals, voice signals, magnetic signals, bio-signals, or touch signals) from outside the electronic system 1000 and may convert the sensed or received signals into data. To this end, the sensor module 1050 may include a sensing device, for example, one or more of various types of sensing devices such as microphones, imaging devices, image sensors, light detection and ranging (LIDAR) sensors, ultrasonic sensors, infrared sensors, biosensors, and touch sensors.

The sensor module 1050 may provide the data, into which the sensed or received signals are converted, as input data to the neural network device 1030. For example, the sensor module 1050 may include an image sensor, may generate a video stream by capturing an external environment of the electronic system 1000, and may sequentially provide consecutive data frames of the video stream as input data to the neural network device 1030. However, examples are not limited thereto, and the sensor module 1050 may provide various types of data to the neural network device 1030.

The communication module 1060 may include various wired or wireless interfaces capable of communicating with an external device. For example, the communication module 1060 may include a local area network (LAN), a wireless local area network (WLAN) such as wireless fidelity (Wi-Fi), a wireless personal area network (WPAN) such as Bluetooth, a wireless universal serial bus (USB), ZigBee, near-field communication (NFC), radio-frequency identification (RFID), power-line communication (PLC), or a communication interface capable of connecting to a mobile cellular network such as third generation (3G), fourth generation (4G), or long-term evolution (LTE).

Figure 11:
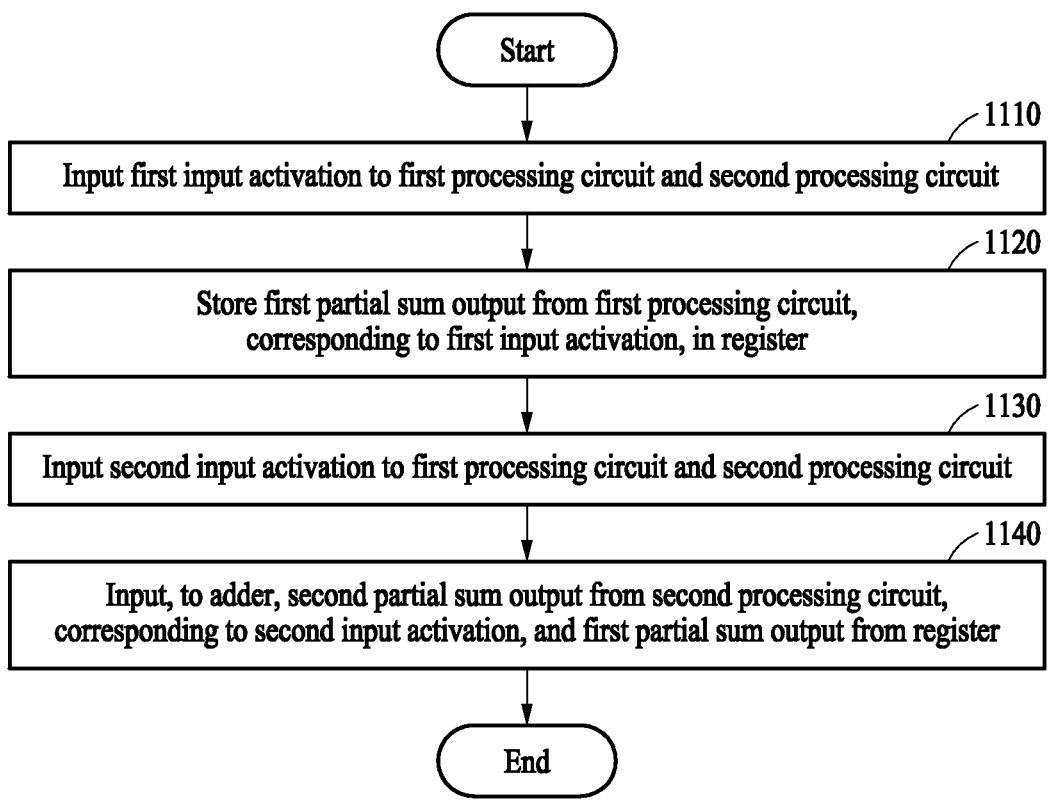
FIG. 11 illustrates an example of an operating method of a neural network apparatus.

FIG. 11 illustrates an example of an operating method of a neural network apparatus.

Referring to FIG. 11, in operation 1110, the neural network apparatus may input a first input activation to a first processing circuit and a second processing circuit. Each of the first processing circuit and the second processing circuit may perform a VMM operation on a weight and an input activation.

Each of the first processing circuit and the second processing circuit may include an RW circuit configured to read and write a weight value of a crossbar array, a decoder configured to decode the input activation to an analog signal, an ADC configured to convert an output activation into a digital signal, and one or more crossbar arrays configured to perform a MAC operation. The one or more crossbar arrays may share the RW circuit, the decoder, and the ADC. Each of the first processing circuit and the second processing circuit may perform the MAC operation using one crossbar array selected from the one or more crossbar arrays.

Each of the crossbar arrays may include a plurality of row lines, a plurality of column lines intersecting the plurality of row lines, and a plurality of memory cells that are arranged at intersections of the plurality of row lines and the plurality of column lines and that are configured to store weights included in a kernel.

In operation 1120, the neural network apparatus may store a first partial sum output from the first processing circuit, corresponding to the first input activation, in a register. In operation 1130, the neural network apparatus may input a second input activation to the first processing circuit and the second processing circuit.

In operation 1140, the neural network apparatus may input, to an adder, a second partial sum output from the second processing circuit, corresponding to the second input activation, and the first partial sum output from the register. The neural network apparatus may input an output of the adder to a post-processing circuit configured to perform post-processing. The neural network apparatus may delay the output of the adder and may input the output to the post-processing circuit.

It should be understood that the operating method of the neural network apparatus is not limited to an operating method of performing an operation using two processing circuits, and that a neural network operation may be performed by repeatedly performing the above-described method for a plurality of processing circuits. Also, it should be understood that the operation of the neural network described with reference to FIGS. 4 to 9 also applies to the operating method of the neural network apparatus, even though description thereof is omitted in FIG. 9.

The in-memory computing circuits, analog crossbar arrays, ADCs, row lines, memory cells, neural network apparatuses, processing elements, input circuits, processing circuits, registers, adders, post-processing circuits, RW circuits, decoders, crossbar arrays, first processing circuits, second processing circuits, third processing circuits, first registers, second registers, first adders, second adders, IFM buffers, control circuits, weight RW circuits, first processing circuit groups, second processing circuit groups, third processing circuit groups, fourth processing circuit groups, delay circuits, electronic systems, processors, RAMs, neural network devices, memories, sensor modules, communication modules, in-memory computing circuit 3, analog crossbar array 30, ADC 40, row lines 310, memory cells 330, neural network apparatus 400, processing elements 401, input circuits 410, processing circuits 430, registers 450, adders 470, post-processing circuit 490, RW circuit 510, decoder 530, crossbar arrays 550, ADC 570, processing element 600, input circuit 610, first processing circuit 630, second processing circuit 631, third processing circuit 632, first register 650, second register 651, first adder 670, second adder 671, IFM buffer 611, control circuit 613, weight RW circuit 615, neural network apparatus 900, input circuits 910, first processing circuit group 931, second processing circuit group 932, third processing circuit group 933, fourth processing circuit group 934, delay circuits 950, post-processing circuit 970, electronic system 1000, processor 1010, RAM 1020, neural network device 1030, memory 1040, sensor module 1050, communication module 1060, and other apparatuses, units, modules, devices, and components described herein with respect to FIGS. 1-11 are implemented by or representative of hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result.

In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-11 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

What is claimed is:

1. A neural network apparatus comprising:
a first processing circuit configured to perform a first vector-by-matrix multiplication (VMM) operation on an input activation and a first weight;
a second processing circuit configured to perform a second VMM operation on the input activation and a second weight;
a first register configured to store an output of the first processing circuit;
an adder configured to add an output of the first register and an output of the second processing circuit;
a second register configured to store an output of the adder; and an input circuit configured to input a same input activation to the first processing circuit and the second processing circuit and control the first processing circuit and the second processing circuit.

2. The apparatus of claim 1, wherein each of the first processing circuit and the second processing circuit comprises:
a read-write (RW) circuit configured to read and write the weight;
a decoder configured to decode the input activation to an analog signal;
an analog-to-digital converter (ADC) configured to convert an output activation into a digital signal; and
one or more crossbar arrays configured to perform the VMM operation, the one or more crossbar arrays sharing the RW circuit, the decoder, and the ADC.

3. The apparatus of claim 2, wherein each of the first processing circuit and the second processing circuit is configured to perform the VMM operation using one crossbar array selected from the one or more crossbar arrays.

4. The apparatus of claim 2, wherein each of the one or more crossbar arrays comprises:
a plurality of row lines;
a plurality of column lines intersecting the plurality of row lines; and
a plurality of memory cells arranged at intersections of the plurality of row lines and the plurality of column lines and configured to store weights included in a kernel.

5. The apparatus of claim 1, wherein the input circuit comprises:
an input feature map buffer configured to store an input feature map comprising the input activation;
a control circuit configured to control the first processing circuit and the second processing circuit; and
a weight read-write (RW) circuit configured to control the weights.

6. A neural network apparatus comprising:
a plurality of processing circuits each configured to perform a vector-by-matrix multiplication (VMM) operation on a weight and a same input activation;
an input circuit configured to, for each of a plurality of cycles, input the same input activation to the plurality of processing circuits and control the plurality of processing circuits; and
an adder circuit configured to sequentially add outputs of the plurality of processing circuits.

7. The apparatus of claim 6, wherein the adder circuit comprises:
a first register configured to store an output of a first processing circuit among the plurality of processing circuits;
an adder configured to add an output of the first register and an output of a second processing circuit among the plurality of processing circuits; and
a second register configured to store an output of the adder.

8. The apparatus of claim 6, further comprising:
a post-processing circuit configured to perform post-processing on the output of the adder.

9. The apparatus of claim 8, further comprising:
a delay circuit configured to delay an output of the adder circuit and to input the output of the adder to the post-processing circuit.

10. The apparatus of claim 6, wherein each of the plurality of processing circuits comprises:
a read-write (RW) circuit configured to read and write the weight;
a decoder configured to decode the input activation to an analog signal;
an analog-to-digital converter (ADC) configured to convert an output activation into a digital signal; and
one or more crossbar arrays configured to perform the VMM operation, the one or more crossbar arrays sharing the RW circuit, the decoder, and the ADC.

11. The apparatus of claim 10, wherein each of the plurality of processing circuits is configured to perform the VMM operation using one crossbar array selected from the one or more crossbar arrays.

12. The apparatus of claim 10, wherein each of the one or more crossbar arrays comprises:
a plurality of row lines;
a plurality of column lines intersecting the plurality of row lines; and
a plurality of memory cells arranged at intersections of the plurality of row lines and the plurality of column lines and configured to store weights included in a kernel.

13. The apparatus of claim 6, wherein the input circuit comprises:
an input feature map buffer configured to store an input feature map comprising the input activation;
a control circuit configured to control the plurality of processing circuits; and
a weight read-write (RW) circuit configured to control the weight.

14. An operating method of a neural network apparatus, the method comprising:
inputting a first input activation to a first processing circuit and a second processing circuit;
storing a first partial sum output from the first processing circuit in a register, the first partial sum corresponding to the first input activation;
inputting a second input activation to the first processing circuit and the second processing circuit; and
inputting, to an adder, a second partial sum output from the second processing circuit and the first partial sum output from the register, the second partial sum corresponding to the second input activation, the adder is directly connected to the register and the second processing circuit.

15. The method of claim 14, wherein each of the first processing circuit and the second processing circuit is configured to perform a vector-by-matrix multiplication (VMM) operation on a weight and an input activation.

16. The method of claim 14, wherein each of the first processing circuit and the second processing circuit comprises:
a read-write (RW) circuit configured to read and write a weight;
a decoder configured to decode an input activation to an analog signal;
an analog-to-digital converter (ADC) configured to convert an output activation into a digital signal; and
one or more crossbar arrays configured to perform a VMM operation, the one or more crossbar arrays sharing the RW circuit, the decoder, and the ADC.

17. The method of claim 16, wherein each of the first processing circuit and the second processing circuit is configured to perform the VMM operation using one crossbar array selected from the one or more crossbar arrays.

18. The method of claim 16, wherein each of the one or more crossbar arrays comprises:
a plurality of row lines;
a plurality of column lines intersecting the plurality of row lines; and a plurality of memory cells arranged at intersections of the plurality of row lines and the plurality of column lines and configured to store weights included in a kernel.

19. The method of claim 14, further comprising:
inputting an output of the adder to a post-processing circuit configured to perform post-processing.

20. The method of claim 19, further comprising:
delaying, using a delay circuit, the output of the adder and inputting the output of the adder to the post-processing circuit.

21. A non-transitory computer-readable storage medium storing instructions that, when executed by a processor, configure the processor to perform the method of claim 14.

22. A neural network apparatus comprising:
an input circuit configured to input, in a current cycle, a same input activation to a plurality of processing circuits each comprising a crossbar array; and
the plurality of processing circuits, each configured to output, in the current cycle, a multiplication operation result based on the same input activation and a weight corresponding to the crossbar array of the processing circuit,
wherein, for each of the plurality of processing circuits, the input circuit is configured to select, as the crossbar array, a crossbar array corresponding to the current cycle among crossbar arrays of the processing circuit.

23. The apparatus of claim 22, further comprising an adder configured to output, in the current cycle, a sum of an output of an adder from a previous cycle and an output of one of the processing circuit in the current cycle.

24. The apparatus of claim 22, wherein the apparatus is an electronic system configured to generate a recognition signal based on the outputs of the processing circuits.

* * * * *